(12) United States Patent
Liao et al.

(10) Patent No.: US 11,764,218 B2
(45) Date of Patent: *Sep. 19, 2023

(54) SEMICONDUCTOR DEVICE AND A METHOD FOR FABRICATING THE SAME

(71) Applicant: TAIWAN SEMICONDUCTOR MANUFACTURING COMPANY, LTD., Hsinchu (TW)

(72) Inventors: Shun-Jang Liao, Pingjhen (TW); Chia-Chun Liao, Hsinchu (TW); Shu-Hui Wang, Hsinchu (TW); Shih-Hsun Chang, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 148 days.

This patent is subject to a terminal disclaimer.

(21) Appl. No.: 17/353,533

(22) Filed: Jun. 21, 2021

(65) Prior Publication Data
US 2021/0313328 A1 Oct. 7, 2021

Related U.S. Application Data

(60) Continuation of application No. 16/722,763, filed on Dec. 20, 2019, now Pat. No. 11,043,491, which is a
(Continued)

(51) Int. Cl.
*H01L 27/092* (2006.01)
*H01L 21/8234* (2006.01)
(Continued)

(52) U.S. Cl.
CPC .... *H01L 27/0922* (2013.01); *H01L 21/28088* (2013.01); *H01L 21/76897* (2013.01);
(Continued)

(58) Field of Classification Search
CPC .......... H01L 27/0922; H01L 21/28088; H01L 21/76897; H01L 21/82345;
(Continued)

(56) References Cited

U.S. PATENT DOCUMENTS 9,502,416 B1 11/2016 Kim
9,576,952 B2 2/2017 Joshi et al.
(Continued)

FOREIGN PATENT DOCUMENTS

| CN | 104821296 A | 8/2015 |
|---|---|---|
| CN | 104867824 A | 8/2015 |
| TW | 506076 B | 10/2002 |

OTHER PUBLICATIONS

Taiwanese Office Action issued in corresponding Taiwanese Application No. 106104370, dated Jan. 8, 2018.
(Continued)

*Primary Examiner* — Tong-Ho Kim
(74) *Attorney, Agent, or Firm* — McDermott Will & Emery LLP

(57) ABSTRACT

A semiconductor device includes first-type-channel field effect transistors (FETs) including a first first-type-channel FET including a first gate structure and a second first-type-channel FET including a second gate structure. The first first-type-channel FET has a smaller threshold voltage than the second first-type-channel FET. The first gate structure includes a first work function adjustment material (WFM) layer and the second gate structure includes a second WFM layer. At least one of thickness and material of the first and second WFM layers is different from each other.

20 Claims, 8 Drawing Sheets

Related U.S. Application Data continuation of application No. 16/049,378, filed on Jul. 30, 2018, now Pat. No. 10,825,813, which is a division of application No. 15/355,717, filed on Nov. 18, 2016, now Pat. No. 10,037,995.

(60) Provisional application No. 62/293,636, filed on Feb. 10, 2016.

(51) Int. Cl.
| | |
|---|---|
| *H01L 27/088* | (2006.01) |
| *H01L 29/78* | (2006.01) |
| *H01L 21/28* | (2006.01) |
| *H01L 21/768* | (2006.01) |
| *H01L 21/8238* | (2006.01) |
| *H01L 29/49* | (2006.01) |

(52) U.S. Cl.
CPC ............... *H01L 21/82345* (2013.01); *H01L 21/823814* (2013.01); *H01L 21/823821* (2013.01); *H01L 21/823842* (2013.01); *H01L 27/088* (2013.01); *H01L 27/092* (2013.01); *H01L 27/0924* (2013.01); *H01L 29/4966* (2013.01); *H01L 29/785* (2013.01)

(58) Field of Classification Search
CPC ..... H01L 21/823814; H01L 21/823821; H01L 21/823842; H01L 27/088; H01L 27/092; H01L 27/0924; H01L 29/4966; H01L 29/785; H01L 21/823431; H01L 21/823456; H01L 21/82385; H01L 27/0886
USPC ........................................................ 257/369
See application file for complete search history.

(56) References Cited

U.S. PATENT DOCUMENTS

| | | | | |
|---|---|---|---|---|
| 10,825,813 | B2 * | 11/2020 | Liao | ................ H01L 27/088 |
| 11,043,491 | B2 * | 6/2021 | Liao | ................ H01L 29/785 |
| 2004/0106249 | A1 | 6/2004 | Huotar | |
| 2012/0129301 | A1 | 5/2012 | Or-Bach et al. | |
| 2015/0214112 | A1 | 7/2015 | Zhao | |
| 2015/0243658 | A1 | 8/2015 | Joshi et al. | |
| 2015/0357244 | A1 | 12/2015 | Ragnarsson et al. | |
| 2016/0276224 | A1 | 9/2016 | Gan et al. | |

OTHER PUBLICATIONS

Non-Final Office Action dated Nov. 3, 2017, issued in U.S. Appl. No. 15/355,717 (13 pages).
Non-Final Office Action dated May 19, 2017, issued in U.S. Appl. No. 15/355,717 (7 pages).
Notice of Allowance dated Mar. 28, 2018, issued in U.S. Appl. No. 15/355,717 (13 pages).
Non-final Office Action issued in corresponding U.S. Appl. No. 16/049,378, dated Jun. 25, 2019.
Notice of Allowance issued in corresponding U.S. Appl. No. 16/049,378, dated Oct. 4, 2019.
Non-final Office Action issued in corresponding U.S. Appl. No. 16/049,378, dated Mar. 3, 2020.
Notice of Allowance issued in corresponding U.S. Appl. No. 16/049,378, dated Jun. 29, 2020.
Non-Final Office Action issued in U.S. Appl. No. 16/722,763, dated Aug. 4, 2020.
Final Office Action issued in U.S. Appl. No. 16/722,763, dated Dec. 9, 2020.
Notice of Allowance issued in U.S. Appl. No. 16/722,763, dated Feb. 16, 2021.

\* cited by examiner

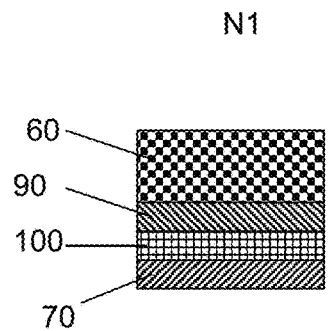
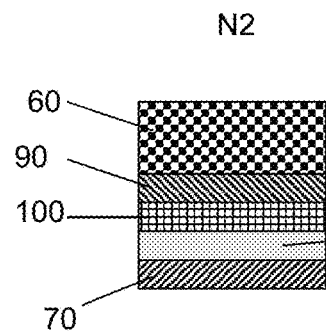
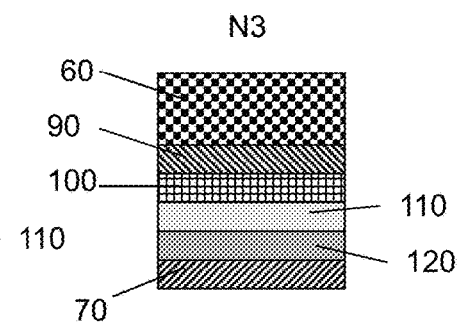
FIG. 8A  FIG. 8B  FIG. 8C
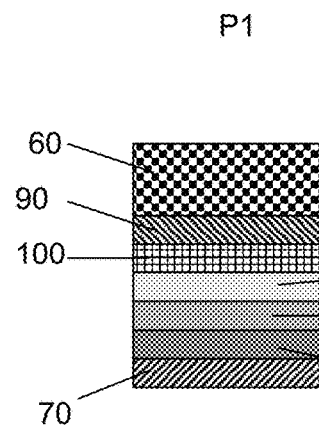
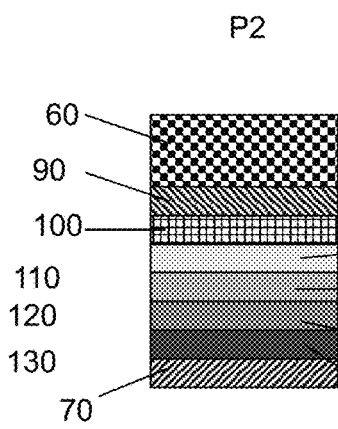
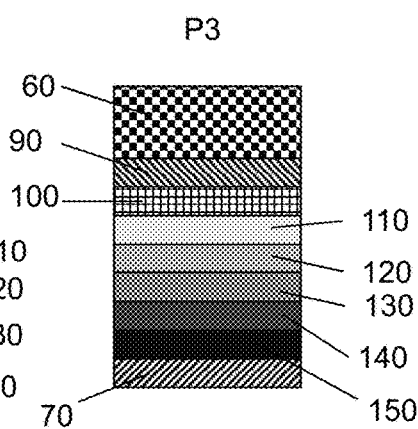
FIG. 9A  FIG. 9B  FIG. 9C N1　　N2　　N3
FIG. 10A
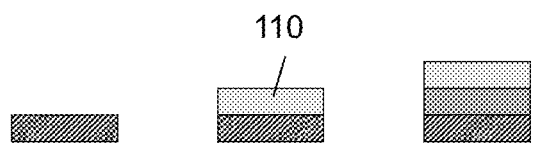
FIG. 10B
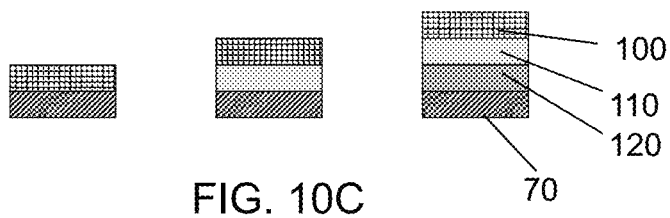
FIG. 10C
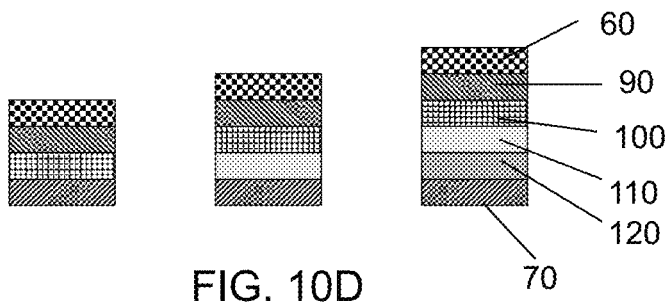
FIG. 10D
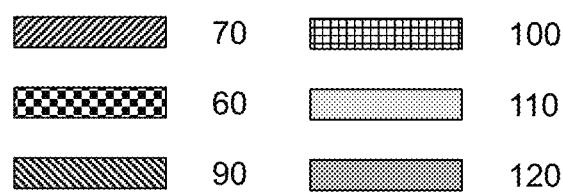

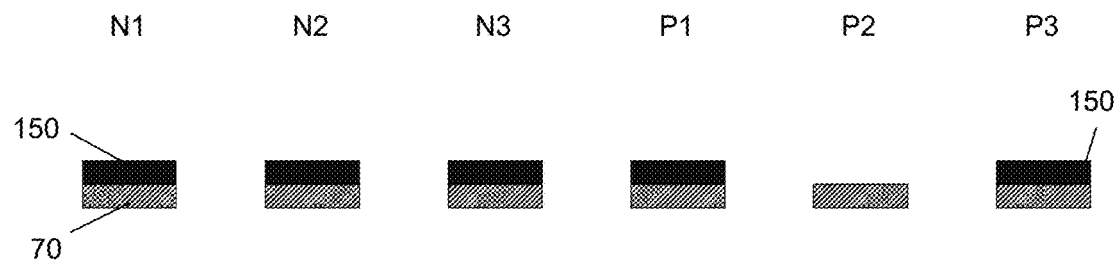
FIG. 11A
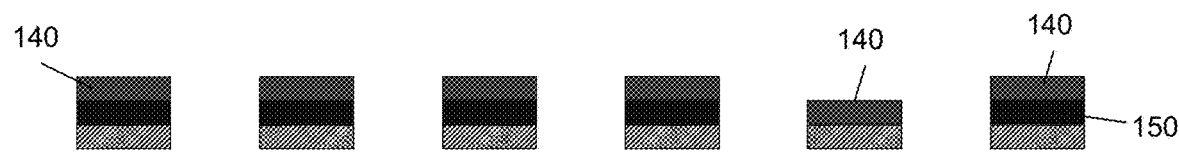
FIG. 11B
FIG. 11C
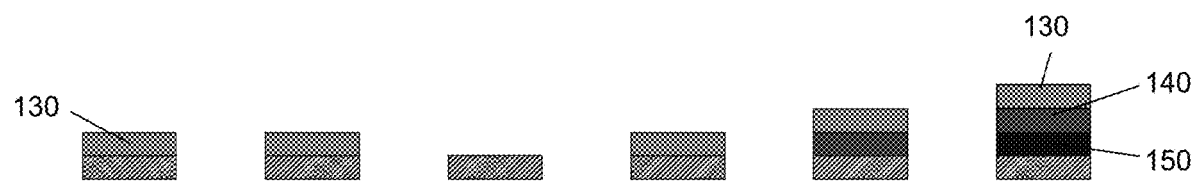
FIG. 11D
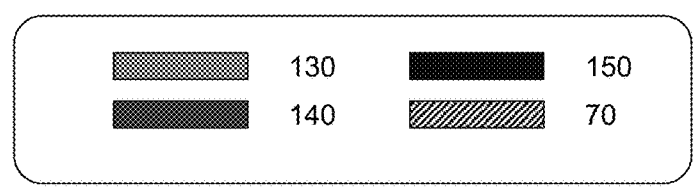

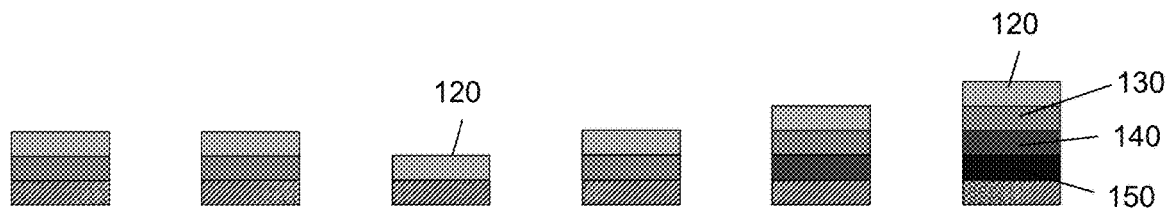
FIG. 11E
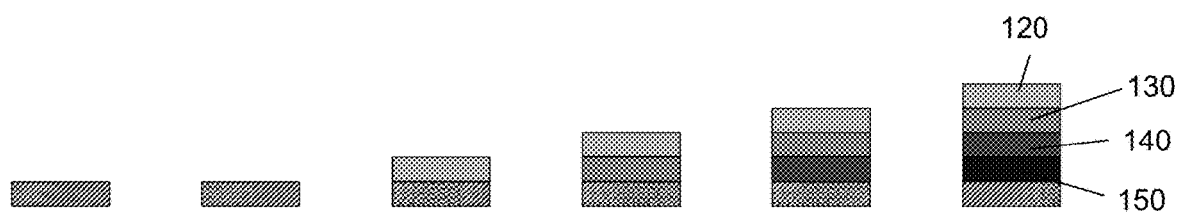
FIG. 11F
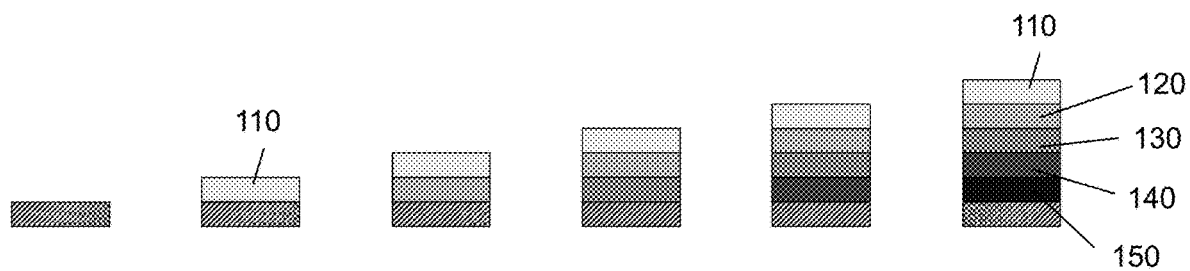
FIG. 11G
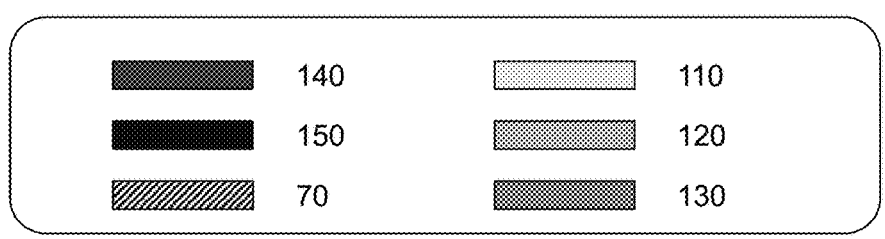

SEMICONDUCTOR DEVICE AND A METHOD FOR FABRICATING THE SAME

CROSS-REFERENCE TO RELATED APPLICATIONS

This application is a Continuation of U.S. application Ser. No. 16/722,763 filed Dec. 20, 2019, now U.S. Pat. No. 11,043,491, which is a Continuation of U.S. application Ser. No. 16/049,378 filed Jul. 30, 2018, now U.S. Pat. No. 10,825,813, which is a Divisional Application of U.S. application Ser. No. 15/355,717 filed on Nov. 18, 2016, now U.S. Pat. No. 10,037,995, which claims priority to U.S. Provisional Patent Application 62/293,636 filed Feb. 10, 2016, the entire disclosures of each of which are incorporated herein by reference.

TECHNICAL FIELD

The disclosure relates to a method for manufacturing a semiconductor device, and more particularly to a structure and a manufacturing method for a self-aligned contact structure over source/drain regions.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (Fin FET) and the use of a metal gate structure with a high-k (dielectric constant) material. The metal gate structure is often manufactured by using gate replacement technologies.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 8A-8C and 9A-9C show enlarged exemplary cross sectional views corresponding to area 61 of FIG. 6 for various transistors according to various embodiments of the present disclosure.

FIGS. 10A-10D show exemplary cross sectional views illustrating various stages of the sequential fabrication process of a metal gate structure according to one embodiment of the present disclosure.

FIGS. 11A-11H show exemplary cross sectional views illustrating various stages of the sequential fabrication process of a metal gate structure according to another embodiment of the present disclosure.

DETAILED DESCRIPTION

Figure 1:
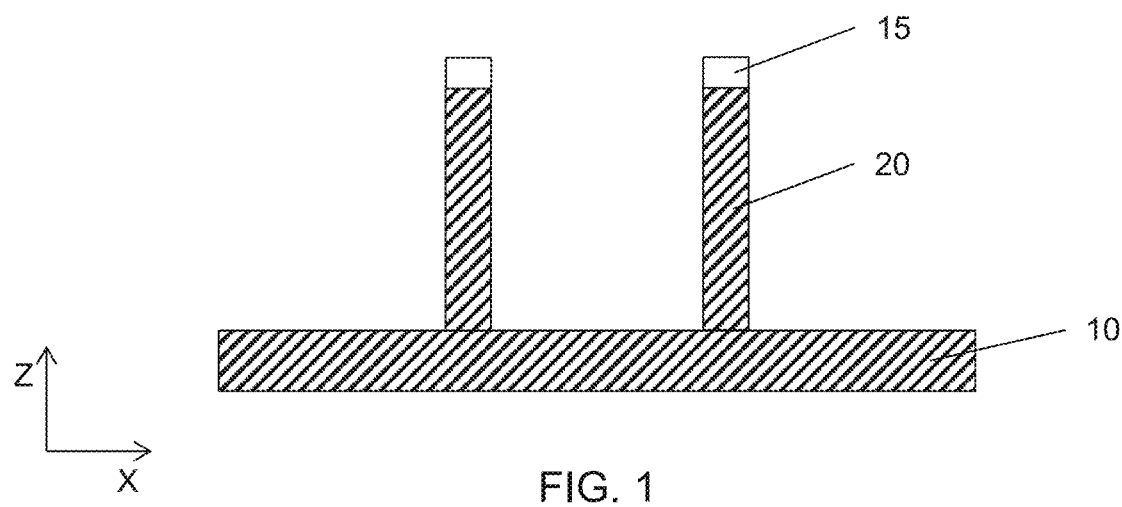
FIGS. 1-6 show exemplary cross sectional views illustrating various stages of the sequential fabrication process of a semiconductor device according to one embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of"

FIGS. 1-6 show exemplary cross sectional views illustrating various stages of the sequential fabrication process of a semiconductor device according to one embodiment of the present disclosure.

First, one or more fin structures 20 are fabricated over a substrate 10. The fin structures include a bottom region and an upper region as a channel region. The substrate is, for example, a p-type silicon substrate with an impurity concentration in a range from about $1 \times 10^{15}$ cm$^{-3}$ to about $1 \times 10^{18}$ cm$^{-3}$. In other embodiments, the substrate is an n-type silicon substrate with an impurity concentration in a range from about $1 \times 10^{15}$ cm$^{-3}$ to about $1 \times 10^{18}$ cm$^{-3}$. Alternatively, the substrate may comprise another elementary semiconductor, such as germanium; a compound semiconductor including Group IV-IV compound semiconductors such as SiC and SiGe, Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate is a silicon layer of an SOI (silicon-on-insulator) substrate.

To fabricate the fin structures 20, a mask layer is formed over the substrate 10 and a patterning operation, including a lithography process and an etching process, is performed on the mask layer, thereby forming a mask pattern 15. The mask pattern 15 includes one or more layers of insulating material, such as SiO$_2$ and SiN. In some embodiments, the mask pattern 15 includes a lower layer made of SiO$_2$ and an upper layer made of SiN. The mask layer is formed by thermal oxidation, LPCVD (low pressure chemical vapor deposition), plasma-CVD, or other suitable film formation methods.

By using the mask pattern 15 as an etching mask, the substrate 10 is trench-etched to form the fin structures 20, as shown in FIG. 1

After forming the fin structures 20, an isolation insulating layer 30 is formed over the fin structures 20. The isolation insulating layer 30 includes one or more layers of insulating materials such as silicon oxide, silicon oxynitride or silicon nitride, formed by LPCVD (low pressure chemical vapor deposition), plasma-CVD or flowable CVD. The isolation insulating layer may be formed by one or more layers of spin-on-glass (SOG), SiO, SiON, SiOCN and/or fluorine-doped silicate glass (FSG).

Figure 2:
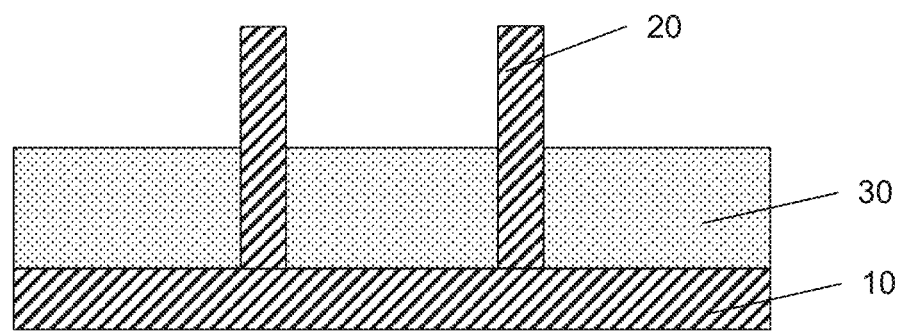

After forming the isolation insulating layer 30 over the fin structures, a planarization operation is performed so as to remove the upper part of the isolation insulating layer 30. The planarization operation may include a chemical mechanical polishing (CMP) and/or an etch-back process. Then, the isolation insulating layer 30 is further removed (recessed) so that the upper regions of the fin structure 20 are exposed, as shown in FIG. 2. The exposed portion of the fin structure 20 will become a channel region of a FinFET.

Figure 3:
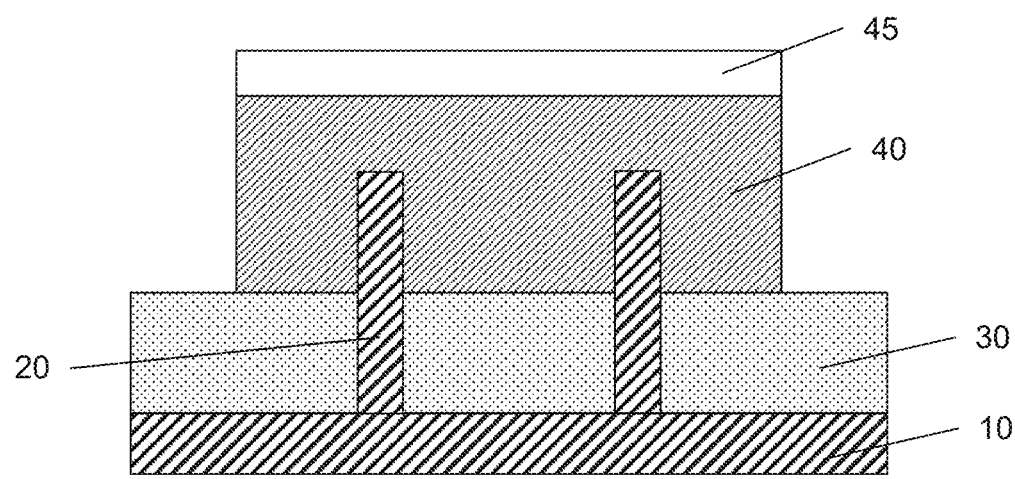

As shown in FIG. 3, a dummy gate structure 40 is formed over the exposed fin structures 20. The dummy gate structure 40 includes a dummy gate electrode layer made of poly silicon and a dummy gate dielectric layer made of silicon oxide. Sidewall spacers (not shown) including one or more layers of insulating materials are also formed on sidewalls of the dummy gate structure.

To fabricate the dummy gate structure, a blanket layer of the dummy gate dielectric layer is formed over the structure of FIG. 2, and a blanket layer of the polysilicon layer is formed over the dummy gate dielectric layer. A mask layer is formed over the polysilicon layer, and a patterning operation is performed on the mask layer, thereby obtaining a mask pattern 45. By using the mask pattern 45 as an etching mask, the polysilicon layer is patterned to form the dummy gate structure 40, as shown in FIG. 3.

In the present disclosure, two fin structures for one dummy gate structure are shown in FIGS. 1-6. However, the numbers of the fin structures and the dummy gate structure are not limited to that shown in FIGS. 1-6. The dummy gate structure 40 extends in the X direction, while the fin structures extend in the Y direction (not shown) and are arranged in the X direction, where the Y direction is perpendicular to the X direction and the Z direction.

After the dummy gate structure 40 is formed, the fin structure 20 not covered by the dummy gate structure is recessed below the upper surface of the isolation insulating layer 30. Then, source/drain regions (not shown) are formed over the recessed fin structures by using an epitaxial growth method. The source/drain regions may include a strain material to apply stress to the channel region.

Figure 4:
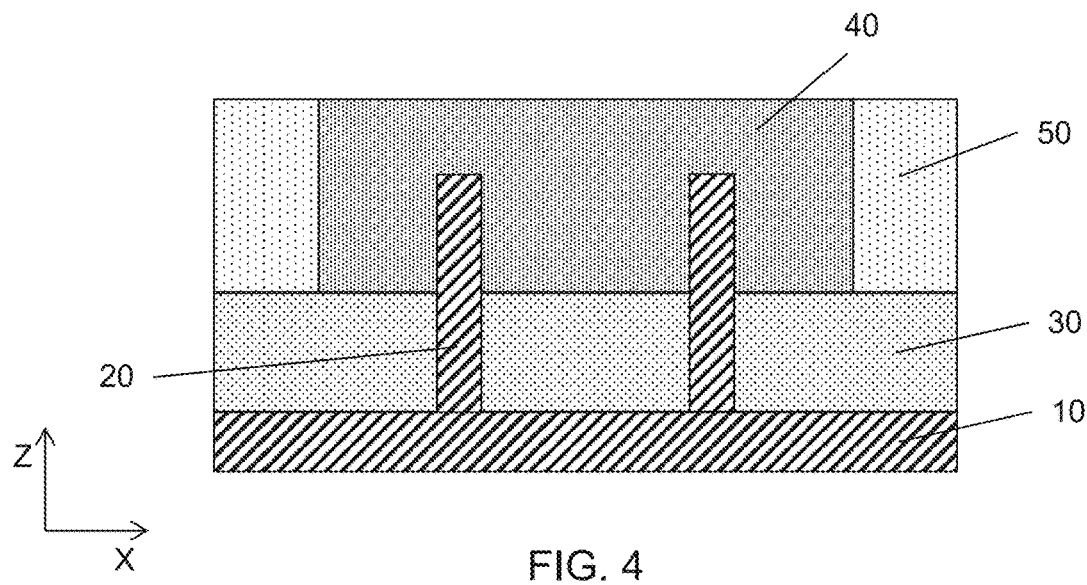
Figure 5:
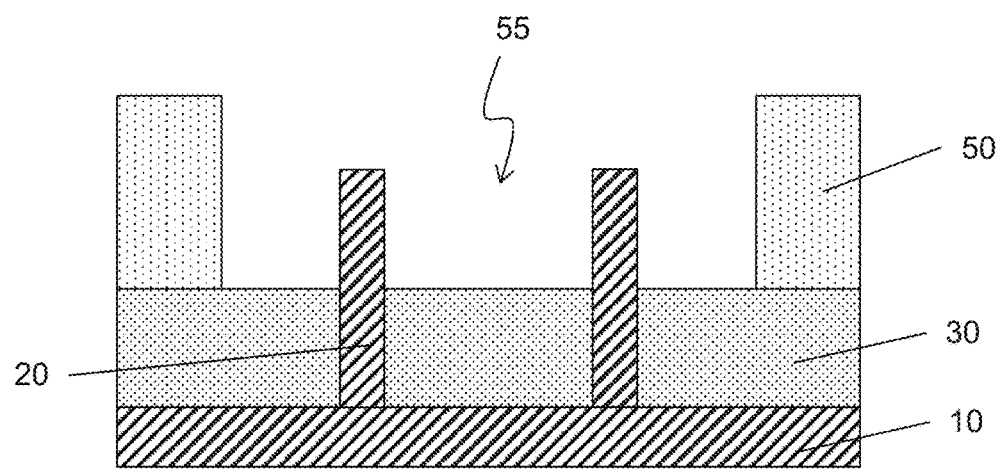

Then, an interlayer dielectric layer (ILD) 50 is formed over the dummy gate structure 40 and the source/drain region, as shown in FIG. 4. After a planarization operation, the dummy gate structure 40 is removed so as to make a gate space 55, as shown in FIG. 5. Then, in the gate space 55, a metal gate structure 60 is formed, as shown in FIG. 6.

Figure 6:
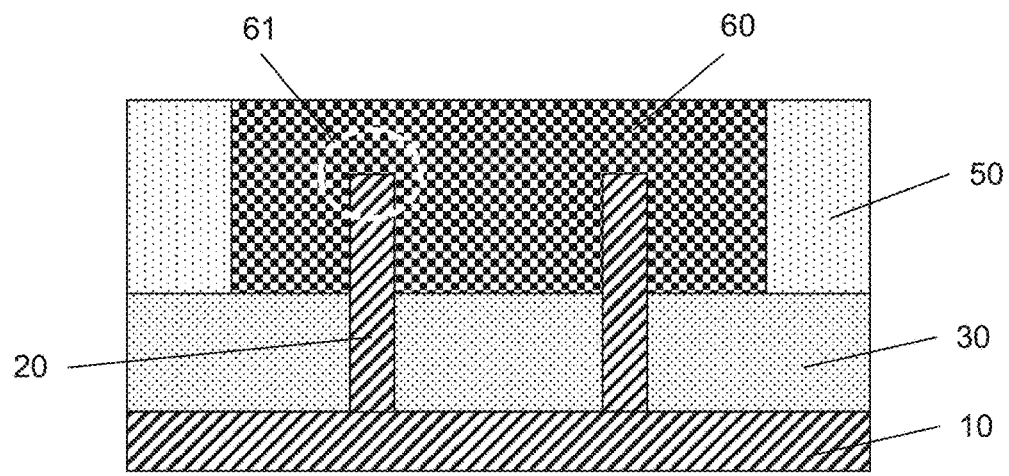
Figure 7:
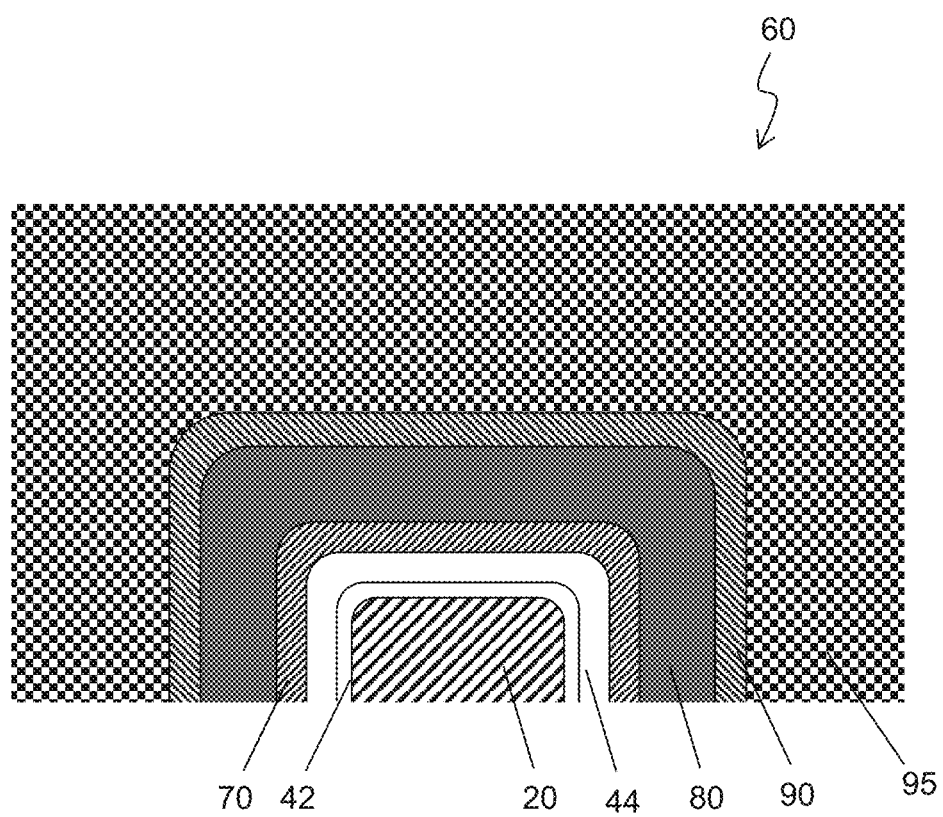
FIG. 7 shows an enlarged exemplary cross sectional view corresponding to area 61 of FIG. 6.

FIG. 7 shows an enlarged exemplary cross sectional view corresponding to area 61 of FIG. 6.

A gate dielectric layer 44 is formed over the upper portion (channel region) of fin structure 20 after an interfacial layer 42 is formed over the fin structure 20. The gate dielectric layer 44 includes one or more layers of metal oxides such as a high-k metal oxide. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. The interfacial layer 42 is made of, for example silicon dioxide. The gate dielectric layer 44 is formed by CVD, atomic layer deposition (ALD), or other suitable film formation methods.

Further, a first conductive layer 70, which functions as a barrier or protective layer in the subsequent etching processes, is formed over the gate dielectric layer 44. The first conductive layer 70 includes one or more layers of Ti, Ta, TiN and TaN. In one embodiment, a TaN layer is used. In other embodiments, a TaN layer is formed on a Ti layer.

The metal gate structure 60 further includes one or more layers of work function adjustment material (WFM) 80 formed over the first conductive layer 70. A second conductive layer 90 is formed over the WFM layer 80, and then a third conductive layer 95 of a major gate metal layer is formed over the second conductive layer.

The second conductive layer 90 functions as an adhesive layer for the third conductive layer, and includes one or more layers of Ti, Ta, TiN and TaN. In one embodiment, a TiN layer is used. The third conductive layer 95 includes a metal material, such as W, Co, Ni, Cu, Al, or alloy thereof, or other suitable materials.

The WFM layers 80 includes one or more layers of conductive material such as TiN, TaN, TaAlC, TiC, TaC, Co, Al, TiAl, HfTi, TiSi, TaSi or TiAlC. For the n-channel FET, one or more of TaN, TaAlC, TiN, TiC, Co, TiAl, HfTi, TiSi and TaSi are used as the WFM layers, and for the p-channel FET, one or more of TiAlC, Al, TiAl, TaN, TaAlC, TiN, TiC and Co are used as the WFM layers.

Some semiconductor devices include various transistors having different threshold voltages. For example, two or three different threshold voltages are set for n-channel FETs and two or three different threshold voltages are set for p-channel FETs. In the present disclosure, by adjusting the thickness of the WFM layer 80 and/or materials for the WFM layer 80, threshold voltages (Vt) for various transistors can be adjusted.

FIGS. 8A-8C show exemplary structures of the WFM layer corresponding to area 61 of FIG. 6 for n-channel transistors according to various embodiments of the present disclosure.

FIG. 8A is for a first n-channel FET N1 having a threshold voltage Vn1 (e.g., ultra-low voltage), FIG. 8B is for a second n-channel FET N2 having a threshold voltage Vn2 (e.g., low-voltage), and FIG. 8C is for a third n-channel FET N3 having a threshold voltage Vn3 (e.g., standard voltage). Here, Vn1<Vn2<Vn3. The three n-channel FETs are disposed in a core area in some embodiments.

In FIG. 8A, the first n-channel FET N1 includes a first WFM layer 100 as the WFM layer 80. In one embodiment, the first WFM layer 100 includes TiAlC. The thickness of the first WFM layer 100 is in a range from about 0.5 nm to 10 nm, in some embodiments, and in a range from about 3 nm to about 5 nm in other embodiments.

In FIG. 8B, the second n-channel FET N2 includes a second WFM layer 110 formed over the first conductive layer 70 and the first WFM layer 100 formed over the second WFM layer 110, as the WFM layer 80. In one embodiment, the second WFM layer 110 includes TiN. It is noted that the WFM layer closest to the channel region of the fin structure substantially determines the threshold voltage. The thickness of the second WFM layer 110 is in a range from about 0.5 nm to 1.2 nm, in some embodiments.

In FIG. 8C, the third n-channel FET N3 includes a third WFM layer 120 formed over the first conductive layer 70, the second WFM layer 110 formed over the third WFM layer 110 and the first WFM layer 100 formed over the second WFM layer 110, as the WFM layer 80. In one embodiment, the third WFM layer 120 includes TiN. If any of two adjacent WFM layer are made of the same material, the two adjacent WFM layers can be treated as one "thick" WFM layer. For example, when the third WFM layer 120 and the second WFM layer 110 are formed of the same material, the third WFM layer 120 and the second WFM layer 110 can be treated as one "thick" WFM layer. The thickness of the third WFM layer 120 is in a range from about 0.5 nm to 1.3 nm, in some embodiments.

As shown in FIGS. 8A-8C, the total thickness of the WFM layer 80 for the first n-channel FET is the smallest, while the total thickness of the WFM layer 80 for the third n-channel FET is the largest, among the first to third n-channel FETs.

As set forth above, by adjusting the thickness of the WFM layer 80 and materials for the WFM layer 80, threshold voltages (Vt) for the first to third n-channel FETs can be adjusted to $0<Vn1<Vn2<Vn3$.

FIGS. 9A-9C show exemplary structures of the WFM layer corresponding to area 61 of FIG. 6 for p-channel transistors according to various embodiments of the present disclosure.

FIG. 9A is a first p-channel FET P1 having a threshold voltage Vp1 (e.g., standard voltage), FIG. 9B is a second p-channel FET P2 having a threshold voltage Vp2 (e.g., low voltage), and FIG. 9C is a third p-channel FET P3 having a threshold voltage Vp3 (e.g., ultra-low voltage). Here, $Vp1<Vp2<Vp3<0$ V. The three p-channel FETs are disposed in a core area in some embodiments.

In FIG. 9A, the first p-channel FET P1 includes a fourth WFM layer 130 formed over the first conductive layer 70, the third WFM layer 120, the second WFM layer 110 and the first WFM layer 100, as the WFM layer 80. In one embodiment, the fourth WFM layer includes TiN. The thickness of the fourth WFM layer 130 is in a range from about 1.0 nm to 2.0 nm, in some embodiments.

In FIG. 9B, the second p-channel FET P2 includes a fifth WFM layer 140 formed over the first conductive layer 70, the fourth WFM layer 130, the third WFM layer 120, the second WFM layer 110 and the first WFM layer 100, as the WFM layer 80. In one embodiment, the fifth WFM layer 140 includes TiN. The thickness of the fifth WFM layer 140 is in a range from about 0.5 nm to 1.5 nm, in some embodiments.

In FIG. 9C, the third p-channel FET P3 includes a sixth WFM layer 150 formed over the first conductive layer 70, the fifth WFM layer 140, the fourth WFM layer 130, the third WFM layer 120, the second WFM layer 110 and the first WFM layer 100, as the WFM layer 80. In one embodiment, the sixth WFM layer 150 includes TiN. The thickness of the sixth WFM layer 150 is in a range from about 1.0 nm to 2.5 nm, in some embodiments.

If any of two adjacent WFM layer are made of the same material, the two adjacent WFM layers can be treated as one "thick" WFM layer. For example, when the sixth (fifth, fourth or third) to second WFM layers are formed of the same material, the sixth (fifth, fourth or third) to second WFM layers can be treated as one "thick" WFM layer.

As shown in FIGS. 9A-9C, the total thickness of the WFM layer 80 for the first p-channel FET is the smallest, while the total thickness of the WFM layer 80 for the third p-channel FET is the largest, among the first to third p-channel FETs. Further, the total thickness of the WFM layer 80 for the first p-channel FET is larger than the total thickness of the third n-channel FET.

As set forth above, by adjusting the thickness of the WFM layer 80 and materials for the WFM layer 80, threshold voltages (Vt) for the first to third p-channel FETs can be adjusted to $Vp1>Vp2>Vp3$.

In FIGS. 8A-9C, the first n-channel FET includes one WFM layer of a first material (e.g., TiAlC), and the second and third n-channel FETs and the first to third p-channel FETs include two WFM layers of the first material and a second material (e.g., TiN) with different thicknesses of the second material. In some embodiments, the WFM layer of the first material (100) is not included in at least one of the second and third n-channel FETs and the first to third p-channel FETs. In other embodiments, a WFM layer of the second material is formed over the WFM layer of the first material in the first n-channel FET. Further, in some embodiments, three or more materials are used for the WFM layers. Yet in other embodiments, the WFM layers 80 for the first to third n-channel FETs and the first to third p-channel FETs are made of the same material with different thicknesses. In such a case, the thickness of the WFM layer 80 for the first n-channel FET N1 is smallest, while the thickness of the WFM layer 80 for the third p-channel FET P3 is the largest.

In addition, in some embodiments, the semiconductor device includes two types of n-channel FETs with different threshold voltages and/or two types of p-channel FETs with different threshold voltages. In other embodiments, the semiconductor device includes four or more types of n-channel FETs with different threshold voltages and/or four or more types of p-channel FETs with different threshold voltages.

In some embodiments, the three n-channel FETs and three p-channel FETs are disposed in an I/O (input/output) area, in which a thickness of the gate dielectric layer is greater than the core area. In certain embodiments, the thickness of the gate dielectric layer in the I/O area is in a range from about 3 nm to about 6 nm, while the thickness of the gate dielectric layer in the core area is in a range from about 0.5 nm to about 2 nm.

FIGS. 10A-10D show exemplary cross sectional views illustrating various stages of the sequential fabrication process of a metal gate structure according to one embodiment of the present disclosure. In FIGS. 10A-10D, the fabrication processes for metal gate structures for n-channel FETs are illustrated, but substantially the same fabrication processes can be applied to p-channel FETs.

In FIG. 10A, one WFM layer (e.g., the third WFM layer 120) is formed over the first conductive layer 70 for the first to third n-channel FETs N1, N2 and N3, and the third WFM layers 120 formed for the first and second n-channel FETs N1 and N2 are removed by dry etching. By the dry etching, the first conductive layers 70 for the first and second n-channel FETs N1 and N2 are exposed.

In FIG. 10B, another WFM layer (e.g., the second WFM layer 110) is formed over the first conductive layers 70 for the first and second n-channel FETs N1 and N2 and over the third WFM layer 120 for the third n-channel FET N3. Subsequently, the second WFM layer 110 formed over the first n-channel FET N1 is removed by dry etching. By the dry etching, the first conductive layer 70 for the first n-channel FET N1 is exposed.

In FIG. 10C, yet another WFM layer (e.g., the first WFM layer 100) is formed over the first conductive layer 70 for the first n-channel FET N1 and over the second WFM layers 110 for the second and third n-channel FETs N2 and N3. Subsequently, the third conductive layer 90 and the second conductive layer 60 are formed over the first WFM layers 100, as shown in FIG. 10D.

The foregoing fabrication operations include a first operation of forming one or more conductive layers and etching the one or more conductive layers, thereby exposing the first conductive layer, and a second operation of forming a conductive layer and not etching the conductive layer. The fabrication operation for forming the WFM layer for the first n-channel FET N1 includes two first operations and one second operation (the WFM layer 100), the fabrication operation for forming the WFM layer for the second n-channel FET N2 includes one first operation and two second operations (the WFM layers 100 and 110), and the fabrication operation for forming the WFM layer for the third n-channel FET N3 includes three second operations and no first operation.

FIGS. 11A-11H show exemplary cross sectional views illustrating various stages of the sequential fabrication process of a metal gate structure according to one embodiment of the present disclosure. In FIGS. 11A-11H, the fabrication processes for metal gate structures for three n-channel FETs and three p-channel FETs are illustrated.

In FIG. 11A, the sixth WFM layer 150 is formed over the first conductive layers 70 for the first to third n-channel FETs N1, N2 and N3 and the first to third p-channel FETs P1, P2 and P3. Then, the sixth WFM layer 150 formed for the second p-channel FET P2 is removed by dry etching. By the dry etching, the first conductive layer 70 for the second p-channel FET P2 is exposed.

In FIG. 11B, the fifth WFM layer 140 is formed over the first conductive layer 70 for the second p-channel FET P2 and over the sixth WFM layers 150 for the first to third n-channel FETs N1, N2 and N3 and the first and third p-channel FETs P1 and P3. Subsequently, the fifth WFM layers 140 and the sixth WFM layers 150 formed for the first to third n-channel FETs N1, N2 and N3 and the first p-channel FET P2 are removed by dry etching, as shown in FIG. 11C. By the dry etching, the first conductive layers 70 for the first to third n-channel FETs N1, N2 and N3 and the first p-channel FET P2 are exposed.

In FIG. 11D, the fourth WFM layer 130 is formed over the first conductive layers 70 for the first to third n-channel FETs N1, N2 and N3 and the first p-channel FET P2, over the sixth WFM layer 150 formed for the second p-channel FET P2 and over the fifth WFM layer 140 formed for the third p-channel FET P3. Subsequently, the fourth WFM layer 130 formed for the third n-channel FET N3 is removed by dry etching, as shown in FIG. 11D. By the dry etching, the first conductive layer 70 for the third n-channel FET N3 is exposed.

In FIG. 11E, the third WFM layer 120 is formed over the first conductive layer 70 for the third n-channel FET N3 and over the fourth WFM layers 130 formed for the first and second n-channel FETs N1 and N2 and the first to third p-channel FETs P1, P2 and P3. Subsequently, the third WFM layers 120 formed for the first and second n-channel FETs N1 and N2 are removed by dry etching, as shown in FIG. 11F. By the dry etching, the first conductive layers 70 for the first and second n-channel FETs N1 and N2 are exposed.

In FIG. 11G, the second WFM layer 110 is formed over the first conductive layers 70 for the first and second n-channel FETs N1 and N2 and over the third WFM layers 120 formed for the third n-channel FET N3 and the first to third p-channel FETs P1, P2 and P3. Subsequently, the second WFM layer 110 formed for the first n-channel FET N1 is removed by dry etching, as shown in FIG. 11G. By the dry etching, the first conductive layer 70 for the first n-channel FET N1 is exposed.

Figure 11H:
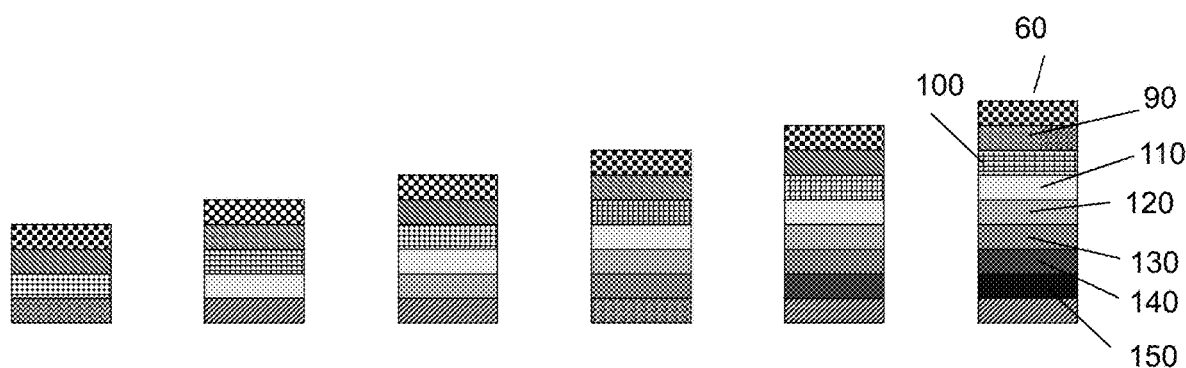
Figure 11H:
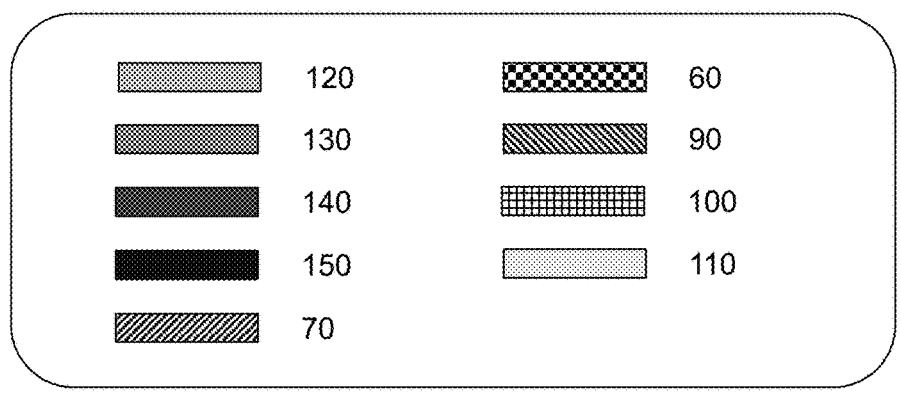

In FIG. 11H, the first WFM layer 100 is formed over the first conductive layer 70 for the first n-channel FET N1 and over the second WFM layers 110 for the second and third n-channel FETs N2 and N3 and the first to third p-channel FETs P1, P2 and P3. Subsequently, the third conductive layer 90 and the second conductive layer 60 are formed over the first WFM layers 100, as shown in FIG. 11H.

The foregoing fabrication operations include a first operation of forming one or more conductive layers and etching the one or more conductive layers, thereby exposing the first conductive layer, and a second operation of forming a conductive layer and not etching the conductive layer.

The fabrication operation for forming the WFM layer for the first n-channel FET N1 includes three first operations and one second operation (the WFM layer 100), the fabrication operation for forming the WFM layer for the second n-channel FET N2 includes two first operations and two second operations (the WFM layers 100 and 110), and the fabrication operation for forming the WFM layer for the third n-channel FET N3 includes two first operations and three second operations (the WFM layers 100, 110 and 120).

The fabrication operation for forming the WFM layer for the first p-channel FET P1 includes one first operation and four second operations (the WFM layers 100, 110, 120 and 130), the fabrication operation for forming the WFM layer for the second p-channel FET P2 includes one first operation and five second operations (the WFM layers 100, 110, 120, 130 and 140), and the fabrication operation for forming the WFM layer for the third p-channel FET P3 includes no first operation and six second operations (the WFM layers 100, 110, 120, 130, 140 and 150).

In the foregoing fabrication operations, the WFM layers can be formed by CVD, physical vapor deposition (PVD) including sputtering, atomic layer deposition (ALD), electroplating, or other suitable film forming methods.

The various embodiments or examples described herein offer several advantages over the existing art. For example, in the present disclosure, by adjusting the thickness of the WFM layer and/or materials for the WFM layer, threshold voltages (Vt) for various transistors can be adjusted. For example, an offset (a difference) of threshold voltages between a low voltage transistor and an ultra-low voltage transistor can be reduced by about 7% for n-channel FET and by about 11% for p-channel FET compared with a conventional technology with a single thickness WFM layer. In some embodiments, the offset for the n-channel FET is 2% of less and the offset for the p-channel FET is less than about 4%. Further, in the fabrication operations of the present disclosure, the number of exposure times of the first conductive layer 70 is at most three, and thus it is possible to minimize the thickness of the first conductive layer 70. Moreover, the dry etching of the WFM layer(s) is performed on at most two WFM layers, and therefore the etching damage to the first conductive layer 70 can be minimized.

It will be understood that not all advantages have been necessarily discussed herein, no particular advantage is required for all embodiments or examples, and other embodiments or examples may offer different advantages.

According to one aspect of the present disclosure, a semiconductor device includes first-type-channel field effect transistors (FETs) including a first first-type-channel FET including a first gate structure and a second first-type-channel FET including a second gate structure. The first first-type-channel FET has a smaller threshold voltage than the second first-type-channel FET. The first gate structure includes a first work function adjustment material (WFM) layer and the second gate structure includes a second WFM layer. At least one of thickness and material of the first and second WFM layers is different from each other According to another aspect of the present disclosure, a semiconductor device includes a first n-channel FET including a first gate structure and having a threshold voltage $V_{n1}$, a second n-channel FET including a second gate structure and having a threshold voltage $V_{n2}$, a third n-channel FET including a third gate structure and having a threshold voltage $V_{n3}$, a first p-channel FET including a fourth gate structure and having a threshold voltage $V_{p1}$, a second p-channel FET including a fifth gate structure and having a threshold voltage Vp2, and a third p-channel FET including a sixth gate structure and having a threshold voltage Vp3. Vn1<Vn2<Vn3 and Vp1<Vp2<Vp3. The first gate structure includes a first work function adjustment material (WFM) layer, the second gate structure includes a second WFM layer, the third gate structure includes a third WFM layer, the fourth gate structure includes a fourth WFM layer, the fifth gate structure includes a fifth WFM layer, and the sixth gate structure includes a sixth WFM layer. At least one of thickness and material of the first to sixth WFM layers is different from each other.

In accordance with yet another aspect of the present disclosure, in a method of manufacturing gate structures for plural field effect transistors (FETs) in a semiconductor device, a gate dielectric layer is formed over each of channel layers for the FETs. A first conductive layer is formed over the gate dielectric layer. A work function adjustment material (WFM) layer is formed over the first conductive layer. A second conductive layer is formed over the WFM layer. The forming the WFM layer for at least one FET includes at least one first operation of forming one or more conductive layers and etching the one or more conductive layers, thereby exposing the first conductive layer, and the forming the WFM layer for at least one FET includes at least one second operation of forming a conductive layer and not etching the conductive layer.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a plurality of p-type field effect transistors (PFETs) having three different threshold voltages, wherein:
the plurality of PFETs include a first PFET having a first gate structure including a first barrier layer disposed over a first gate dielectric layer, and a first work function adjustment material (WFM) layer disposed over the first barrier layer,
the first WFM layer includes a TiN layer and a layer of aluminum containing material disposed over the TiN layer, and
the first PFET has a lowest threshold voltage in an absolute value among the plurality of PFETs.

2. The semiconductor device of claim 1, wherein the aluminum containing material is TiAlC.

3. The semiconductor device of claim 1, wherein:
the first gate structure further includes a first adhesion layer disposed directly on the first WFM layer and a first metal layer disposed on the first adhesion layer.

4. The semiconductor device of claim 3, wherein:
the first adhesion layers includes a TiN layer, and
the first metal layers includes a W layer.

5. The semiconductor device of claim 1, wherein a thickness of the layer of the aluminum containing material is in a range from 0.5 nm to 10 nm.

6. The semiconductor device of claim 1, wherein a thickness of the TiN layer in the first WFM layer is 3.5 nm to 8.5 nm.

7. The semiconductor device of claim 1, wherein the first barrier layer includes a TaN layer.

8. A semiconductor device, comprising:
a first n-channel FET (NEFT) including a first gate structure and having a threshold voltage $Vn1$;
a second NFET including a second gate structure and having a threshold voltage $Vn2$; and
a third NFET including a third gate structure and having a threshold voltage $Vn3$, wherein:
$Vn1<Vn2<Vn3$ in absolute values,
the first gate structure includes a first work function adjustment material (WFM) layer, the second gate structure includes a second WFM layer, and the third gate structure includes a third WFM layer,
at least one of thickness or material of the first to third WFM layers is different from each other, and
each of the first, second and third WFM layers includes an aluminum containing layer.

9. The semiconductor device of claim 8, wherein:
each of the second and third WFM layers includes a TiN layer, and
a thickness of the TiN of the second WFM layer is smaller than a thickness of the third WFM layer.

10. The semiconductor device of claim 8, wherein the TiN layer is disposed below the Al containing layer.

11. The semiconductor device of claim 8, wherein the aluminum containing layer includes TiAlC.

12. The semiconductor device of claim 8, wherein:
the first, second and third WFM layers are formed over a first conductive layer disposed over a gate dielectric layer, and
a second conductive layer is disposed over each of the first, second and third WFM layers with a third conductive layer interposed therebetween.

13. The semiconductor device of claim 12, wherein:
the first conductive layer is a TaN layer,
the second conductive layer includes a W layer, and
the third conductive layer includes a TiN layer.

14. A semiconductor device, comprising:
a first p-channel FET including a first gate structure and having a threshold voltage $Vp1$;
a second p-channel FET including a second gate structure and having a threshold voltage $Vp2$; and
a third p-channel FET including a third gate structure and having a threshold voltage $Vp3$, wherein:

$$Vp1<Vp2<Vp3,$$

the first gate structure includes a first work function adjustment material (WFM) layer, the second gate structure includes a second WFM layer, and the third gate structure includes a third WFM layer,
at least one of thickness and material of the first to third WFM layers is different from each other,
at least two of the first, second or third WFM layers include a first layer made of the first material and a second layer made of a second material different from the first material, and
the first layer is formed over the second layer.

15. The semiconductor device of claim 14, wherein a thickness of the second layer increases in the order of the first WFM layer, the second WFM layer and the third WFM layer.

16. The semiconductor device of claim 14, wherein the second material is TiN.

17. The semiconductor device of claim 14, wherein the first material is TiAlC.

18. The semiconductor device of claim 14, wherein the first, second and third WFM layers are formed over a first conductive layer disposed over a gate dielectric layer.

19. The semiconductor device of claim 18, wherein a second conductive layer is disposed over each of the first, second and third WFM layers with a third conductive layer interposed therebetween.

20. The semiconductor device of claim 19, wherein:
the first conductive layer is a TaN layer,
the second conductive layer includes a W layer, and
the third conductive layer includes a TiN layer.

* * * * *